United States Patent [19]
Pai et al.

[11] Patent Number: 5,344,797
[45] Date of Patent: Sep. 6, 1994

[54] METHOD OF FORMING INTERLEVEL DIELECTRIC FOR INTEGRATED CIRCUITS

[75] Inventors: Chien-Shing Pai, Bridgewater, N.J.; Yih-Cheng Shih, Macungie, Pa.

[73] Assignee: AT&T Bell Laboratories, Murray Hill, N.J.

[21] Appl. No.: 969,680

[22] Filed: Oct. 30, 1992

[51] Int. Cl.⁵ .......................................... H01L 21/316
[52] U.S. Cl. .................................... 437/238; 437/195; 437/228; 437/978; 748/DIG. 118
[58] Field of Search ............... 437/195, 238, 231, 228, 437/978; 748/DIG. 118

[56] References Cited
U.S. PATENT DOCUMENTS 4,872,947 10/1989 Wang et al. ..................... 156/643

FOREIGN PATENT DOCUMENTS 0388862 9/1990 European Pat. Off. ............ 437/231

Primary Examiner—T. N. Quach
Attorney, Agent, or Firm—John T. Rehberg

[57] ABSTRACT

A method of forming an interlevel dielectric suitable for use with semiconductor integrated circuits is disclosed. The dielectric illustratively includes a triple layer sandwich of ozone-TEOS formed between two layers of plasma-enhanced TEOS. The dielectric is capable of filling high-aspect ratio trenches between runners. The ozone-TEOS is formed at a high pressure (approximately 90 Torr) to reduce hydrogen absorption. The reduced-hydrogen content ozone-TEOS is less susceptible to moisture formation and, therefore, presents less risk of degrading subsequently formed aluminum runners.

4 Claims, 1 Drawing Sheet

METHOD OF FORMING INTERLEVEL DIELECTRIC FOR INTEGRATED CIRCUITS

TECHNICAL FIELD

This invention relates to semiconductor integrated circuits and methods for their manufacture.

BACKGROUND OF THE INVENTION

Typical integrated circuit fabrication processes involve the initial formation of transistors in a substrate (typically of semiconductor material). The transistors are interconnected by layers of conductive wiring, often referred to as "runners." The conductive wiring layers are separated by dielectrics, often termed "interlevel dielectrics."

Those concerned with the development of integrated circuit technology have engaged in a continuous search for interlevel dielectrics which will fill small spaces between adjacent runners (i.e., fill high aspect ratio spaces) and which are resistant to moisture absorption or creation. Inadequate filling of high aspect ratio spaces means that adjacent conductive wiring lines are not adequately separated from each other. Furthermore, should the dielectric attract or promote the formation of moisture, conductive wiring materials such as aluminum may be ultimately degraded, thereby adversely affecting circuit performance. These problems are exacerbated as circuit dimensions shrink, for example, in the submission range.

SUMMARY OF THE INVENTION

The presence of hydrogen in dielectrics is believed to contribute to moisture formation. Applicants have discovered a process which produces a dielectric which fills high-aspect ratio spaces and contains less than 10 percent hydrogen. Illustratively, applicants process includes formation of a dielectric overlying a substrate. The dielectric is formed in a reactor having a pressure utilizing a precursor gas containing hydrogen and ozone. The pressure of the reactor is chosen so that the hydrogen content of the dielectric after formation is less than 10 atomic percent. Illustratively, a pressure of approximately 90 Torr works well.

DETAILED DESCRIPTION

Figure 1:
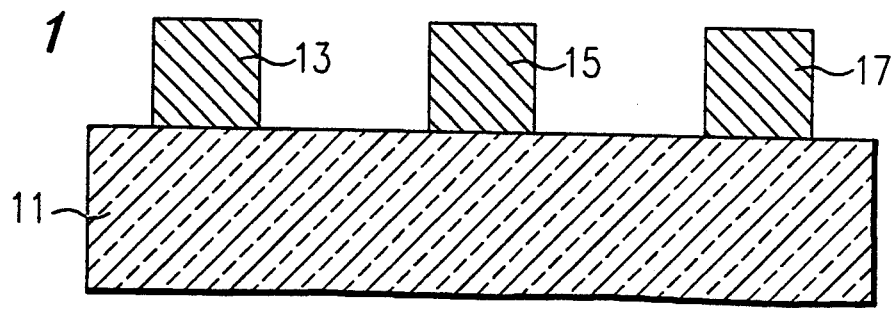
FIGS. 1-4 are cross-sectional views which schematically show an illustrative embodiment of the present invention.

Turning to FIG. 1, reference numeral 11 designates a substrate which may be, typically, silicon, doped silicon, epitaxial silicon, silicon dioxide, silicon nitride, etc. In general the term substrate is used to denote any layer which supports other structures and/or layers. Reference numerals 13, 15, and 17 denote raised topographical features which may typically be conductive wiring, otherwise termed "runners." It is desired to fill the spaces above and between runners 13, 15, and 17 with a dielectric material or materials. Typically, the width and height of each of topographic features 13, 15, and 17 may be 0.6 $\mu$m. The spacing between adjacent features may vary with a minimum spacing of 0.5 $\mu$m.

Figure 2:
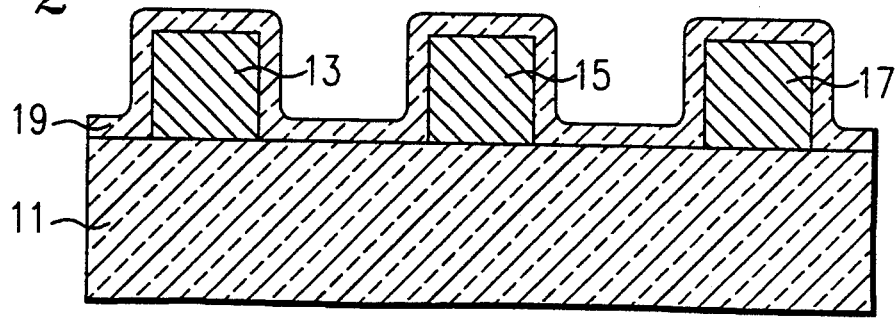

In FIG. 2, an initial dielectric layer 19 is formed from plasma-enhanced TEOS, having a thickness of approximately 0.1 $\mu$m, is formed over features 13, 15, and 17.

Figure 3:
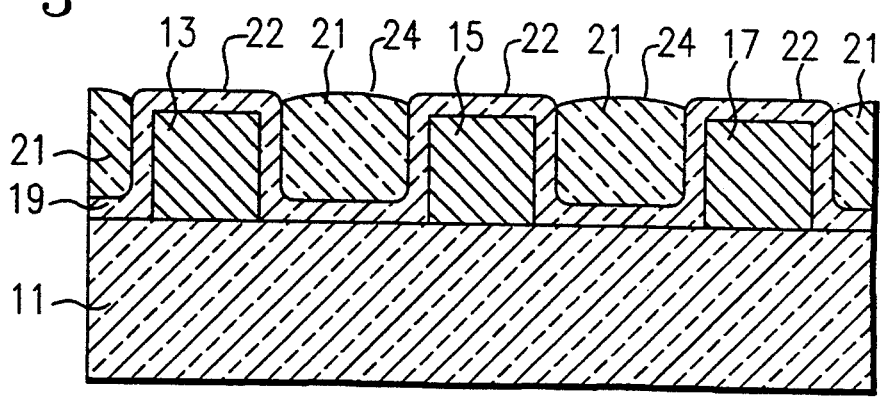

In FIG. 3, dielectric 21 is formed between raised topographic features 13 and 15, and between 15 and 17, etc. Dielectric 21 is formed by depositing a blanket layer of ozone-TEOS (which initially covers the entire upper surface of layer 19). Desirably, layer 21 is formed in an AMI 5000 machine (manufactured by Applied Materials Corporation, Santa Clara, Calif.), utilizing a reactor pressure (i.e., total chamber pressure) of approximately 90 Torr and ozone concentration of 8-12 weight percent, a TEOS flow rate of 1000 sccm in a helium carder and an oxygen flow rate of 1500-2500 sccm. In particular, applicants' process uses a deposition pressure (i.e., total chamber pressure) of approximately 90 Torr, which is substantially higher than typical deposition pressures (which are approximately 40 to 60 Torr for similar layers).

Applicants' analysis of the resulting layer 21 indicates that increasing deposition pressure from 40 to 90 Torr resulted in a decrease of total hydrogen from 20 to 9 atomic percent, while the deposition rate increased from 30–47 Å per second. The substantial reduction in the total hydrogen content is highly desirable because hydrogen combines with ambient oxygen to form water which ultimately degrades the ozone-TEOS layer. Furthermore, applicants' investigations have shown that dielectric 21 provides a void-free filling of the high-aspect ratio spaces between adjacent topographic features 13–15 and 15–17.

After layer 21 is formed, it is etched back in situ (i.e., in the same chamber as that in which it was deposited) using $C_2F_6$ and oxygen. The etchback desirably exposes upper surface 22 of dielectric 19 (above features 13, 15, and 17). Exposure of the upper surface 22 helps to ensure that, subsequently, the opened vias through layer 19 to features 13 and 15 will not expose layer 21 to moisture.

Figure 4:
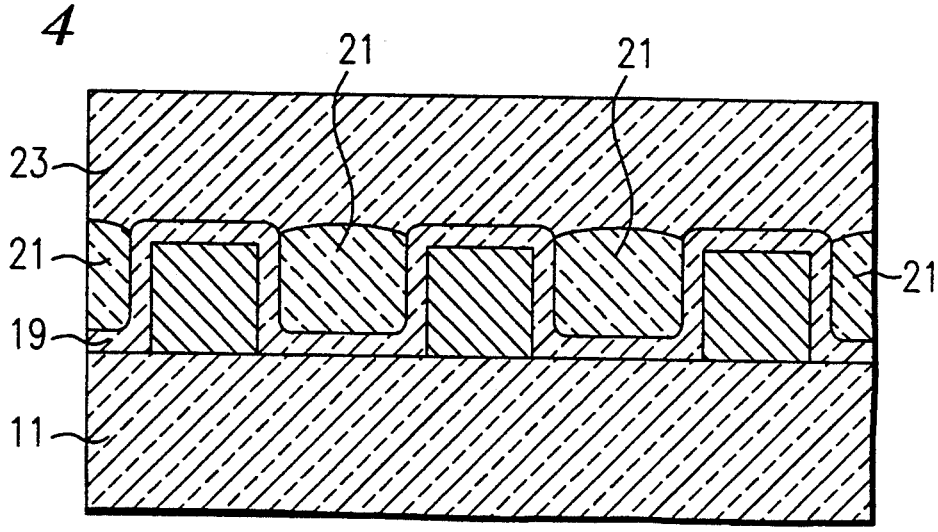

Turning to FIG. 4, between 1,000 and 1,400 angstrom of plasma-enhanced TEOS is deposited on the upper surfaces (24 and 22) of dielectrics 21 and 19, respectively. Dielectric 23 provides further protection against moisture absorption by ozone-TEOS dielectric 21 by encapsulating dielectric 21.

The greater resistance of ozone-TEOS dielectric 21 to moisture formation is particularly important when vertical vias are created through dielectrics 23 and 19, which may inadvertently expose dielectric 21. Should dielectric 21 have too high a hydrogen content, subsequent exposure to oxygen will enhance the formation of water which will degrade aluminum which is subsequently deposited in the via.

Applicants' process may be performed entirely in one chamber of an AMI 5000 apparatus produced by Applied Materials Corporation, Santa Clara, Calif. Applicants' studies have shown that the process produces relatively few particles and the process exhibits substantially higher (e.g. at least twice in applicants' experiments) throughput than multi-chamber processes.

It should be noted in FIG. 2 that there is no need to employ an argon sputtering step to round the corners of dielectric 19 prior to the formation of dielectric 21 in FIG. 3 (as has been done previously). Applicants believe that the argon sputter prior to the ozone-TEOS deposition tends to heat the wafer, lessen throughput, deposit sputter byproducts on the sidewalls, and may ultimately damage metal runners.

We claim:

1. A method of semiconductor integrated circuit fabrication comprising:

forming a first dielectric overlying a substrate, said dielectric being formed in a reactor having a total chamber pressure and utilizing a TEOS precursor gas containing hydrogen and utilizing ozone;

said reactor having a pressure of approximately 90 Torr and an ozone concentration of 8–12 weight percent, a TEOS flow rate of approximately 1000 sccm and an oxygen flow rate of 1500–2500 sccm whereby the hydrogen content of said dielectric after formation is less than 10 atomic percent.

2. A method of semiconductor integrated circuit fabrication comprising:

forming a first silicon dioxide dielectric overlying a substrate in a reactor chamber;

forming a second silicon dioxide dielectric upon said first dielectric, said formation taking place in the same said reactor chamber and utilizing ozone and a precursor gas containing hydrogen;

CHARACTERIZED IN THAT the total chamber pressure of said reactor during formation of said second dielectric is chosen at a sufficiently high value so that the hydrogen content of said second dielectric after formation is less than 10 atomic percent;

etching back said second dielectric in said reactor to expose portions of said first dielectric; and then forming a third dielectric in said same reaction chamber, said third dielectric covering said second dielectric and the said exposed portions of said first dielectric.

3. The method of claim 2 in which the pressure of said precursor gas is approximately 90 Torr.

4. The method of claim 2 in which the precursor gas is TEOS.

* * * * *